United States Patent [19]

Damm et al.

[11] Patent Number: 4,860,291

[45] Date of Patent: Aug. 22, 1989

[54] TEST VECTOR DEFINITION SYSTEM EMPLOYING TEMPLATE CONCEPT

[75] Inventors: Wendell W. Damm, Beaverton; Keith A. Taylor, Portland; Ira G. Pollock, Beaverton; Pedro M. Janowitz, Portland, all of Oreg.

[73] Assignee: Tektronix, Inc., Beaverton, Oreg.

[21] Appl. No.: 138,269

[22] Filed: Dec. 28, 1987

[51] Int. Cl.[4] ............................................. G06F 11/00
[52] U.S. Cl. ........................................ 371/27; 371/17
[58] Field of Search ....................... 371/27, 25, 20, 17, 371/18, 23, 29; 364/200 MS File, 900 MS File; 324/73 R, 73 AT

[56] References Cited

U.S. PATENT DOCUMENTS

| | | | |
|---|---|---|---|
| 4,550,406 | 10/1985 | Neal | 371/27 X |
| 4,601,032 | 7/1986 | Robinson | 371/23 |
| 4,606,025 | 8/1986 | Peters | 371/20 |
| 4,677,620 | 6/1987 | Sutton | 371/27 |
| 4,701,918 | 10/1987 | Nakajima | 371/27 X |
| 4,713,815 | 12/1987 | Bryan | 371/29 |

Primary Examiner—Jerry Smith
Assistant Examiner—Robert W. Beausoliel
Attorney, Agent, or Firm—Boulden G. Griffith

[57] ABSTRACT

A user interface for a tester or simulator includes a menu for creating templates. The templates organize a set of the user's decisions regarding the timing, direction, and masking of all of the signals occurring during one tester cycle into a convenient form for use in another menu where test vectors are actually specified. In this other menu, the templates serve as a shorthand way of describing the function of each channel and its timing characteristics during one tester cycle. Thus, these templates organize and simplify the user's decision making, since many decisions, that would otherwise have to be made again and again, may now be made only once and then incorporated again and again by reference to the appropriate template. The use of the templates also conserves total memory requirements. The template menu can provide visual feedback that includes timing diagrams and icons to assist the user in constructing the template.

9 Claims, 10 Drawing Sheets

FIG. 3

| DAS 9200 | 92V64-1 | Setup | Channel | Moving to Setup Menu |

Group: Group_4    Width: 8    Radix: Hex

| Logical Signal | Channel | Timing | Column Mask |
|---|---|---|---|
| Signal_11 | 0.b | Group | Off |
| Signal_12 | 0.c | Group | Off |
| Signal_13 | 0.d | Group | Off |
| Signal_14 | 0.e | Group | Off |
| Signal_15 | 0.f | Group | Off |
| Signal_16 | 1.0 | Group | Off |
| Signal_17 | 1.1 | Group | Off |
| Signal_18 | 1.2 | Group | Off |

36

| F2 DUT WIRING | F4 CLEAR SPEC | F6 RENAME GROUP | F7 DELETE | F8 ADD |

FIG. 10

| DAS 9200 | 92V64-1 | Setup | Pattern | Moving to Setup Menu |

Line Number Select

| | | Group_0 | Group_1 | Group_2 | Group_3 | Group_4 | Group_5 | Group_6 |
|---|---|---|---|---|---|---|---|---|
| 9 | Cycle_4 | X | 00 | X | X | 000 | 0 | 0 |

| 0 | * | | | | | | | |
| 1 | Cycle_0 | 0 | 00 | X | 0 | 000 | 0 | X |
| 2 | Cycle_1 | 0 | 00 | 0 | X | 020 | 0 | 0 |
| 3 | Cycle_2 | 0 | 01 | X | 0 | 040 | 0 | 0 |
| 4 | Cycle_5 | 0 | 00 | X | 0 | 000 | 0 | 0 |
| 5 | * | | | | | | | |
| 6 | Cycle_3 | 1 | 00 | X | 0 | 200 | 2 | 0 |
| 7 | Cycle_5 | 2 | 00 | X | 1 | 000 | 0 | 0 |
| 8 | Cycle_6 | X | 00 | 0 | 0 | XXX | 0 | 0 |
| 9 | Cycle_4 | X | 00 | X | X | 000 | 0 | 0 |
| 10 | * | | | | | | | |
| 11 | Cycle_2 | 0 | 00 | X | 0 | 000 | 0 | X |
| 12 | Cycle_6 | X | 00 | 1 | 0 | XXX | 3 | 0 |
| 13 | Cycle_2 | 0 | 00 | X | 0 | 010 | 0 | 0 |
| 14 | Cycle_2 | 0 | 00 | X | 0 | 020 | 0 | 0 |
| 15 | * | | | | | | | |
| 16 | Cycle_0 | 0 | 00 | X | 0 | 000 | 0 | X |
| 17 | Cycle_1 | 0 | 00 | 0 | X | 100 | 0 | 0 |
| 18 | Cycle_2 | 1 | 00 | X | 0 | 200 | 2 | 0 |
| 19 | Cycle_5 | 2 | 00 | X | 1 | 000 | 0 | 0 |
| 20 | * | | | | | | | |

| F1 START | F2 PATASM START | F3 UNDO | F4 EXPAND MACRO | F5 DEFINE FORMAT | F6 DELETE LINE | F7 ADD LINE | F8 BLOCK MODE |

TEST VECTOR DEFINITION SYSTEM EMPLOYING TEMPLATE CONCEPT

BACKGROUND OF THE INVENTION

The present invention relates generally to test vector definition systems, and more particularly to the use of a vector template concept in the user interface of an integrated circuit tester. This invention can also be used with logic simulators, where the same sort of data management problems exist.

An integrated circuit (IC) tester allows one to apply a sequence of signals to a device under test (DUT) and monitor its response by comparing that response to expected results. For each tester cycle, the signals to be applied to the input pins and the signals which are expected at the output pins are described by a "vector" of test data. A test is comprised of a sequence of such test vectors. The results of a completed test usually include some sort of listing of the discrepancies between actual and expected data.

To operate a tester, the user must physically connect the channels of the tester to the pins of the device. The first time that a particular device is tested, a lot of work goes into assigning and connecting the tester channels to the device pins. After the first time, the physical connection and channel assignment part of the job is much easier, especially if the tester will store all the decisions made the first time.

In addition to physically connecting the tester channels to the pins of the device, a user typically wishes to logically group the channels and label the channels and groups of channels with logical names. After the channels have been logically organized and named, one of the most difficult parts of the process of setting up the tester is to make all of the decisions about channel functions and masking, and clock timing.

The collective effect of the choices made by the user is to program the tester with a series of vectors to be executed in a specified sequence. The information associated with one vector of data includes, either explicitly or implicitly, at least the following:

Pin direction — Is this channel going to be used as an input or an output during this cycle of tester operation?

Data content — Is this channel expected to produce (or receive) a "1" or a "0" during this tester cycle?

Mask — Do we want to ignore the data content of this channel during this cycle?

Voltage levels — What voltages should be used to represent a high data value and a low data value?

Timing information — When does the signal start and stop relative to the tester clock? How wide is the signal?

Format information — How is the timing information used to format or 'modulate' the signal at the tester pin? (In terms of the overall timing and the logic level that the signal returns to between active signals.)

For a tester which is capable of storing and generating as many as 65,000 vectors, each having a width of up to 256 channels, correctly entering all of this data into the tester is a very formidable task. Moreover, in more sophisticated testers, the operation of the tester may depend on feedback from the device under test, i.e., conditional branching or looping may be controlled by the occurrence or non-occurrence of DUT outputs.

As it becomes impractical to generate such a large number of vectors by hand, other methods for generating them are becoming more important. They may be generated algorithmically, by nesting, looping, and branching control through the use of some sort of programming language, so that a relatively few commands can describe a far larger number of vectors. Moreover, much of the data for inputs and outputs may be derived from simulations of the device on some other piece of equipment and downloaded to the tester for verification of actual performance relative to the predictions of the simulator. Such automated or semi-automated test vector generation is becoming increasingly important as the complexity of devices increases and testers are developed with very deep memories to accommodate the increased complexity.

In the testers of the prior art, a user controls the operation of the tester in one of two ways: either by making selections in a series of menus, or by programming the tester directly using a specialized programming language. The ASIX-1 Tester from ASIX Systems Corporation is an example of a tester that has a menu-driven user interface, while the Sentry Series from Fairchild is an example of a tester controlled with a specialized programming language.

In systems that use a programming language for direct user control of the system, such as the Sentry Series ATE from Fairchild Corporation, which uses a language (FACTOR, by TSSI Corp.) which is specialized for tester control, the user must first learn the language and then keep track of a large amount of data and his own prior decisions while programming the hardware registers of the tester. In such a system, a typical command might look like this:

SET F 0011001100 1100110011 0011001100

1100110011; or

SET F (5:00110011);

each of which sets the first 40 bits of a register (the F register) to a repeating binary value. Note that this command only establishes the state of 40 bits of data for one register controlling one of the numerous parameters that must be established for each tester cycle (vector).

The task of controlling each channel of a powerful tester by direct programmatic control over each bit of each register for every function one vector at a time is an extremely complicated task. It requires the user to be very familiar with the hardware of the tester, as well the programming language involved.

In the menu-driven user interfaces of the prior art, such as the ASIX-1 Tester from ASIX Systems Corporation, the Pin Definition menu allows the user to choose functions, formats, and a timing generator for each pin, but these definitions cannot be altered during execution of a particular test.

What is desired is a way to have control over a maximum number of functions for each channel on a channel-by-channel, vector-by-vector basis, with an easy to use human interface that provides visual feedback, does not require the user to learn a programming language, and makes the task of test vector definition readily manageable.

SUMMARY OF THE INVENTION

The present invention provides a user interface for a tester or simulator that includes a menu for creating "templates". These templates organize a set of the user's decisions regarding the timing, direction, and masking of all of the signals occurring during one tester cycle, and provide visual feedback to make this task easier. In another menu, where vectors are actually defined, these templates serve as a shorthand way of describing the function of each channel and its timing characteristics during one tester cycle. Thus, these templates organize and simplify the user's decision making, since many decisions, that would otherwise have to be made repeatedly, may now be made only once and then incorporated by reference to the appropriate template.

It is an object of this invention to increase the manageability and ease of use of an integrated circuit device tester or a logic simulator by providing the user with an easier way to think about the numerous decisions that must be made in the course of defining a large number of test vectors.

It is a further object of this invention to conserve memory by only storing a small number of templates once and then only storing pointers to the templates on a vector-by-vector basis, rather than storing all of the information in the templates on a vector-by-vector basis.

It is also an object of this invention to provide a user with visual feedback reflecting his choices as format and timing decisions are made within the template menu, thereby improving the user's efficiency and confidence as templates are created and used to specify vectors.

DESCRIPTION OF THE DRAWINGS

FIG. 3 is a screen display containing the Channel menu.

FIG. 10 is a screen display of the Pattern menu.

DESCRIPTION OF THE PREFERRED EMBODIMENT

Figure 1:
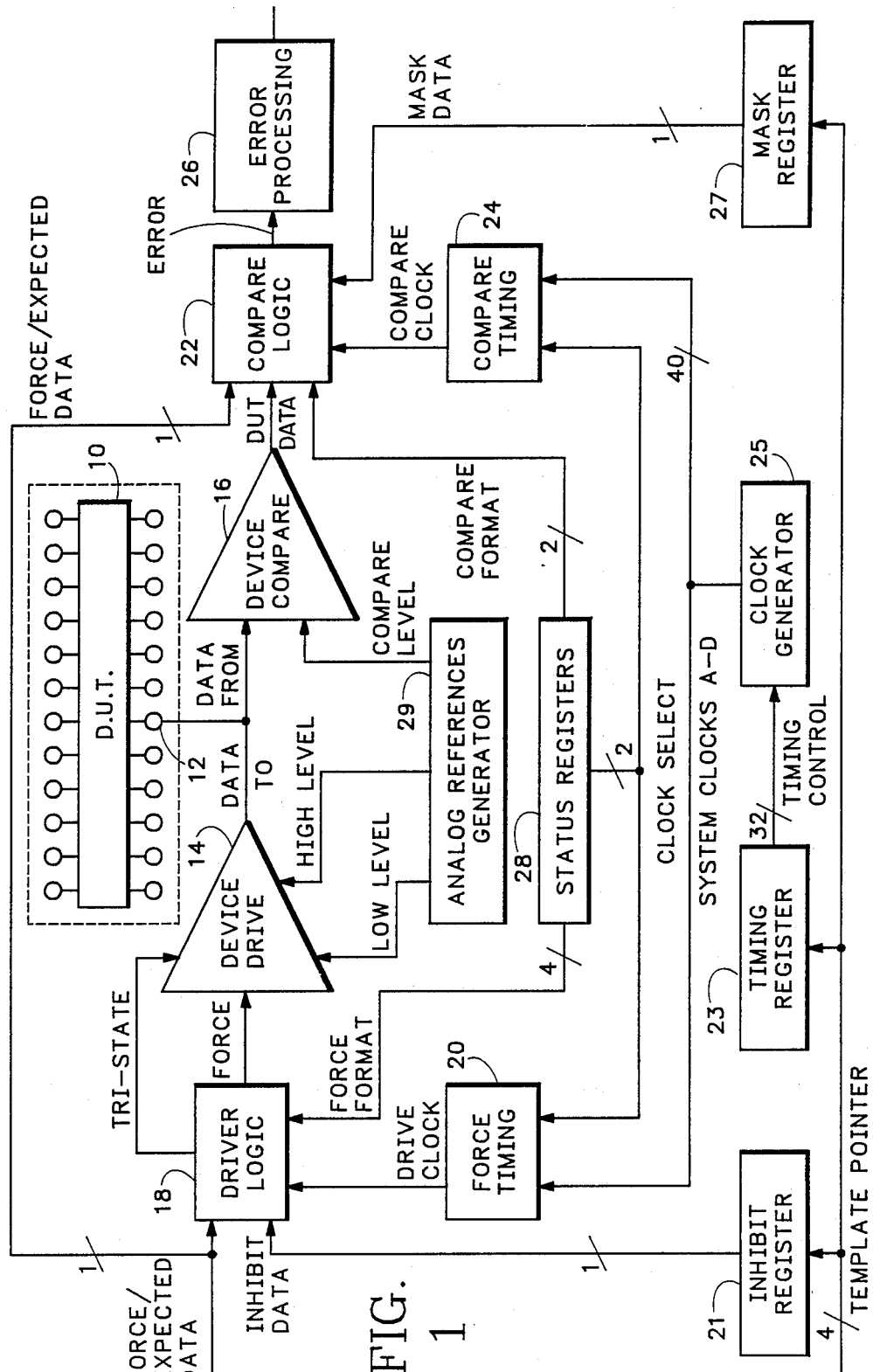
FIG. 1 is a block diagram of a single bi-directional tester channel.

FIG. 1 is a block diagram showing the circuitry associated with a single channel of an integrated circuit device tester of the type that permits complete and separate control of each channel on a vector-by-vector basis. This hardware provides for channel-by-channel and vector-by-vector control of the inhibit data, force data, force timing, expected data, mask data, and compare timing functions. It also provides for channel-by-channel, but not vector-by-vector, control over the force format, compare format, and clock phase selection functions.

Figure 2:
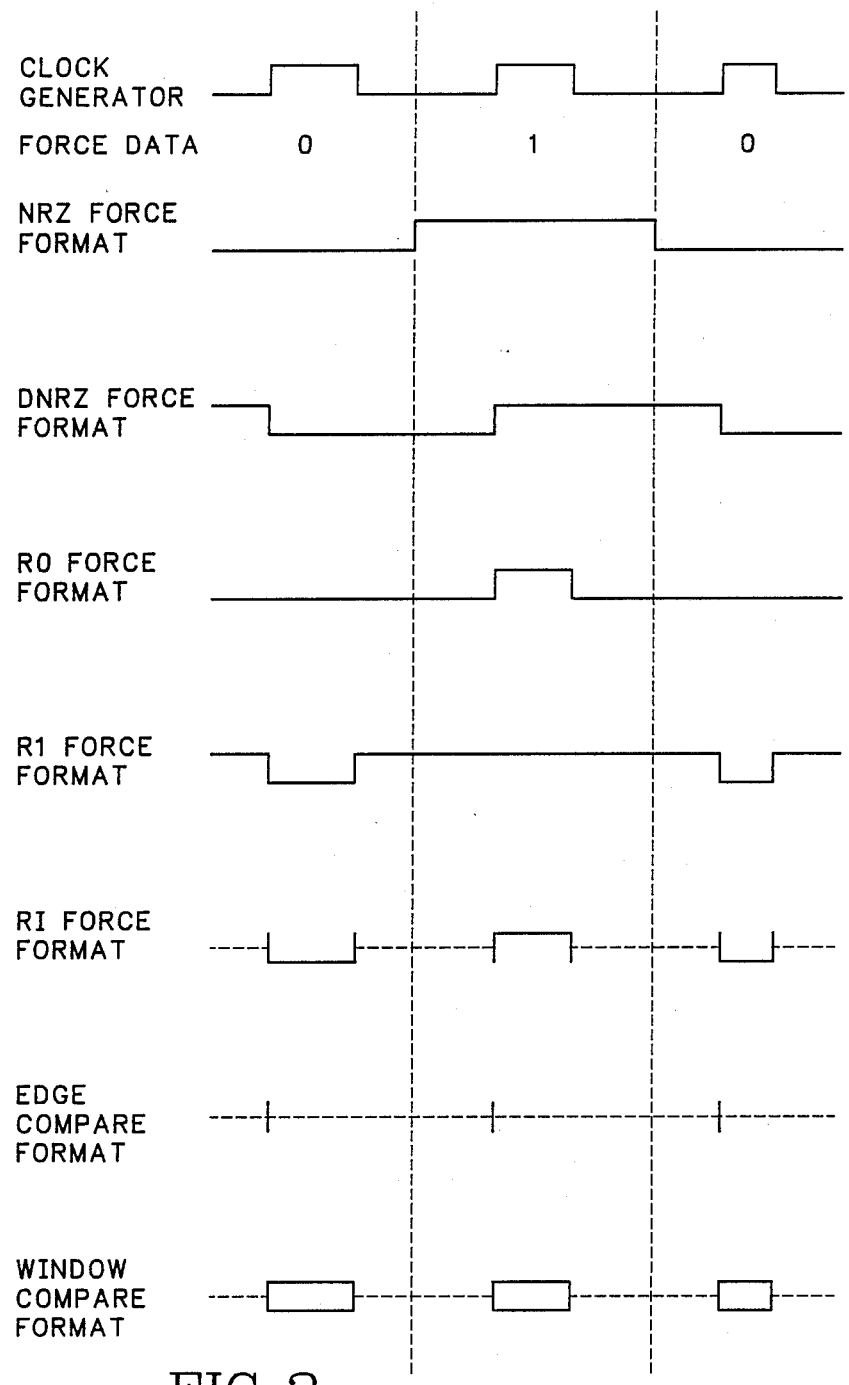
FIG. 2 is a timing diagram showing the differences between the various force formats.
Figure 4:
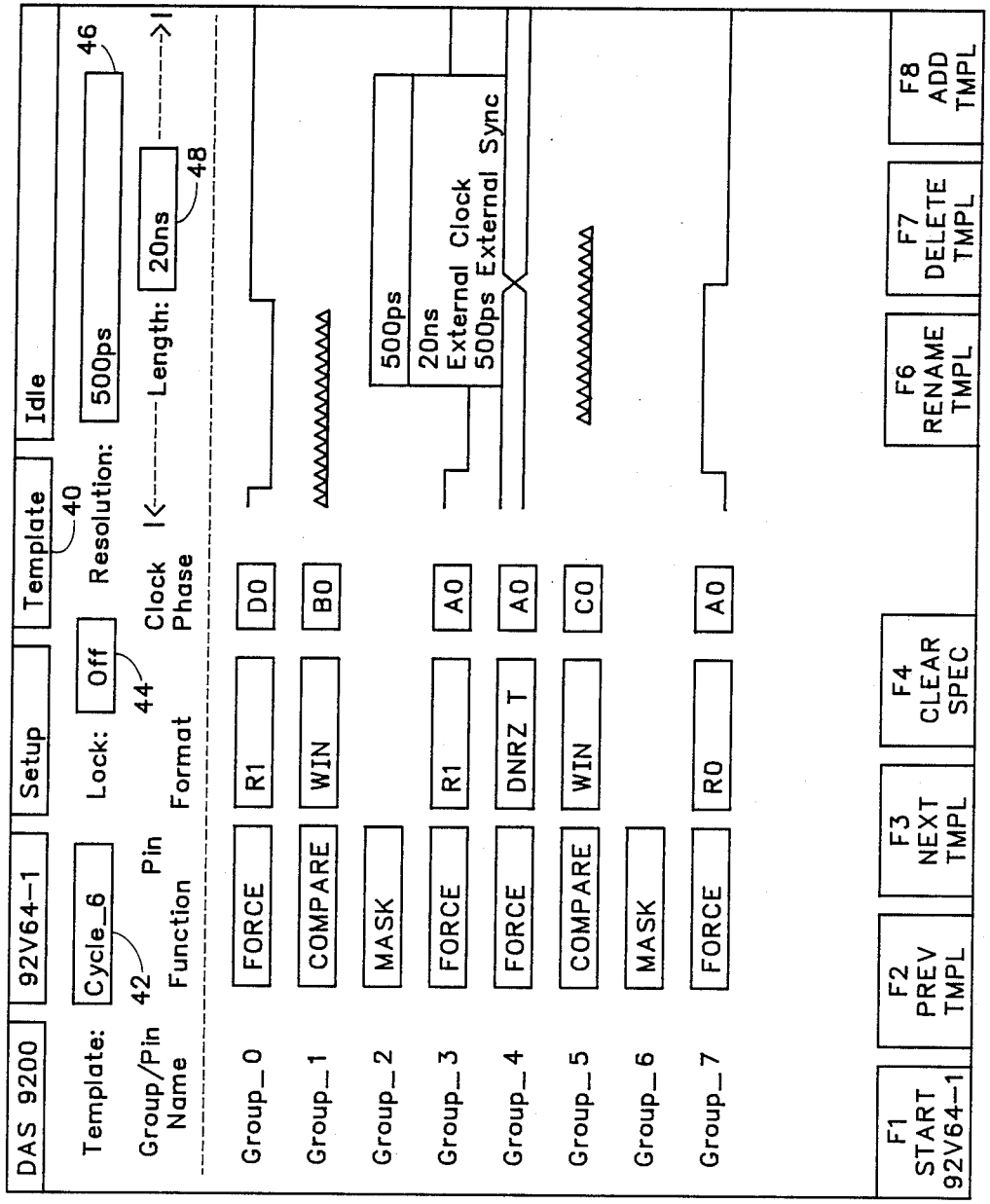
FIG. 4 is a screen display showing the Template menu with the "Resolution" field opened.
Figure 6:
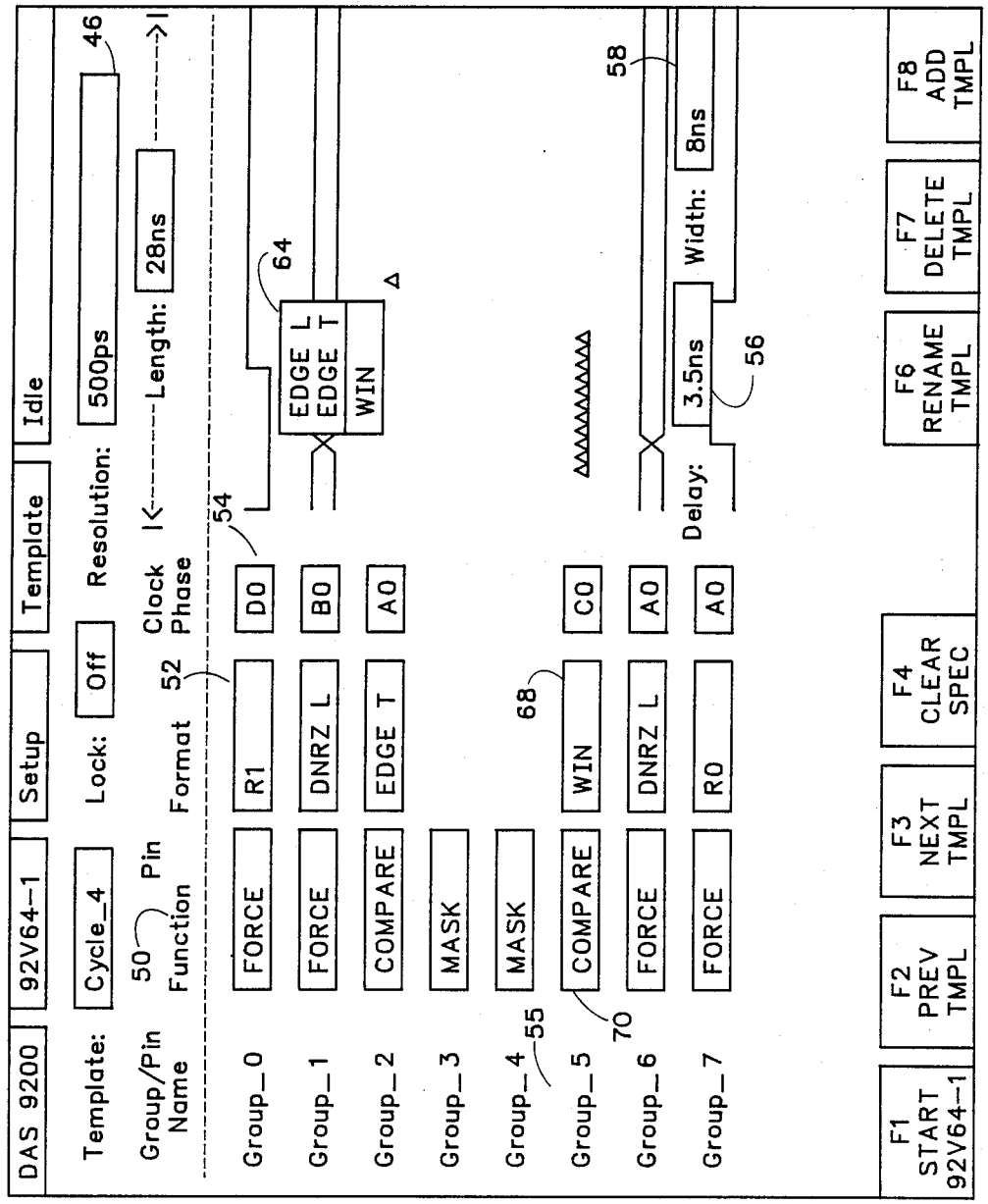
FIG. 6 is a screen display showing the Template menu with the "Format" field opened when the COMPARE function is selected.
Figure 9:
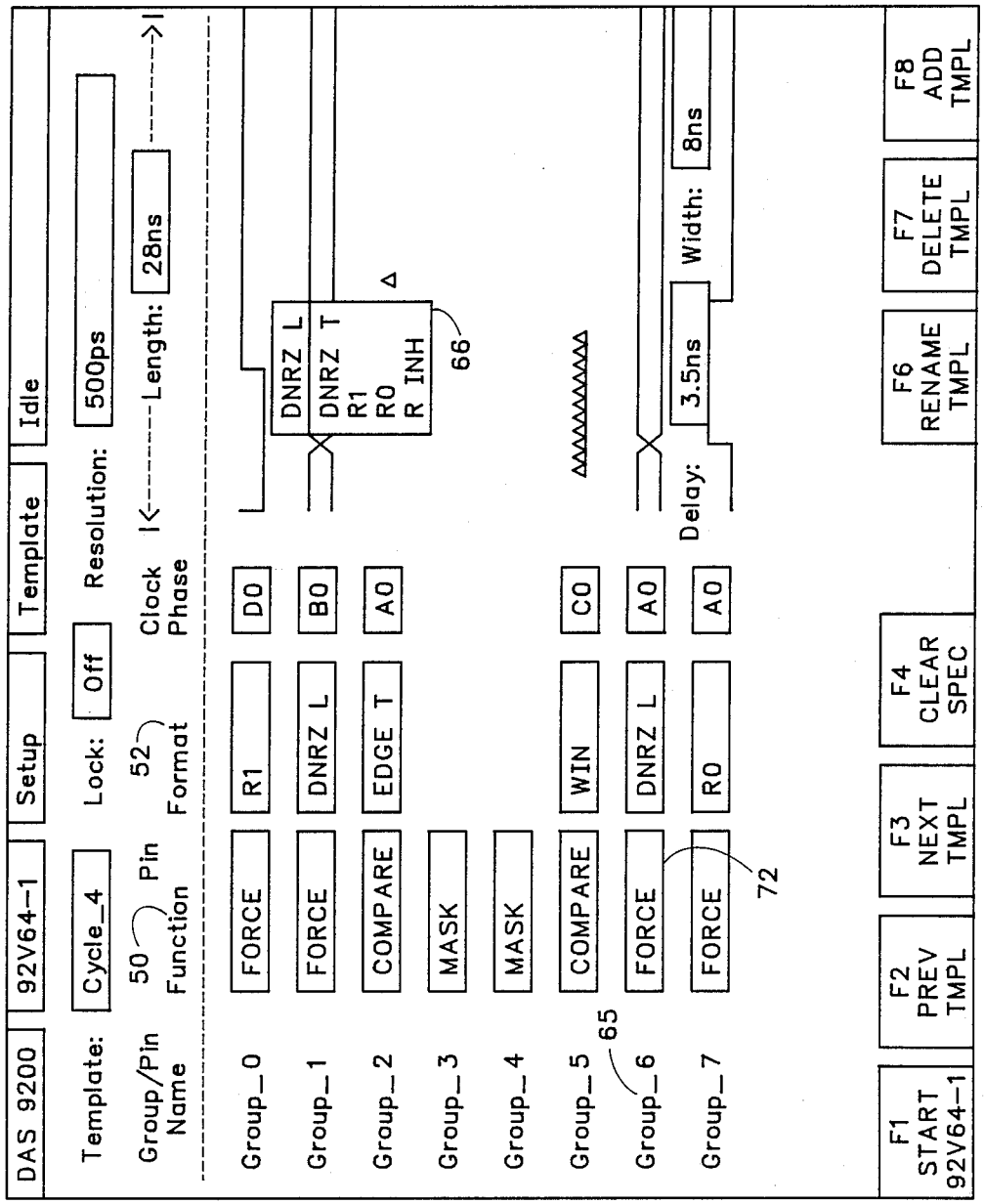
FIG. 9 is a screen display showing the Template menu with the "Format" field opened when the FORCE function is selected.

FIG. 2 is a timing diagram showing the various formats that are available in the tester of the preferred embodiment. These include, return-to-zero, non-return-to-zero, delayed-non-return-to-zero, return-to-one, and return-to-inhibit. As will be described below, these formats are selected by the user in the "Pin Format" field 52 of the Template menu, as shown in FIGS. 6 and 9.

The device under test (DUT) 10 has numerous pins for communication with its environment. One of these pins 12 is shown connected to both the device drive circuitry 14 and the device compare circuitry 16 of one channel of the tester. This connection may be effectuated by some sort of probe or DUT holder card (not shown).

FIG. 1 shows the tester circuitry associated with controlling the signals to and from one pin 12 of the device under test (DUT) 10. Device drive 14 applies a signal, data to, to device pin 12 according to force and tri-state signals from the driver logic circuitry 18. The high and low levels of these signals are controlled by analog voltage signals high level and low level from analog references generator circuitry 29. Data in, the output of device drive 14 is put in a high impedance condition when tri-state is asserted. Driver logic circuitry 18 produces tri-state signals according to the logical content of the inhibit data signal from the inhibit register 21, with the exact timing of entering and leaving the tri-stated condition being controlled by the force format signals (4 bits) from the status registers 28 and the drive clock from the force timing circuit 20. When the tri-state signal is asserted, it causes the device drive circuit 14 to go to a high impedance condition, permitting the DUT 10 to control the pin 12.

Drive logic circuitry 18 also produces the force signal. This signal contains the logical content of the force/expected data signal, with the exact timing of the edges of this signal being controlled by the information contained in the force format signals (4 bits) and the drive clock from the force timing circuit 20. Additional status register information, the two bits of clock select information, control which of the four phases of available system clocks A-D are sent by the force timing circuitry 20 to the driver logic circuitry 18 as the drive clock.

When, as a result of the inhibit data signal from the inhibit register 21 being asserted, a channel is to be controlled by the DUT 10 and data from the device, data from, is to be compared with reference data, the signal force/expected data, tells the compare logic circuitry 22 what logical data to compare this signal with. Device compare circuitry 16 determines when the signal from the device under test 10, data from, is a logical one and when it is a logical zero by comparing data from with an analog threshold signal, compare level from the analog references generator circuitry 29, to generate DUT data.

The exact timing of the comparison between the acquired and expected signals, the strobe point or comparison window, is controlled by a choice of compare clock from the compare timing circuitry 24 and by the information contained in the compare format signals (2 bits) from the status registers 28. If a window comparison is specified, the received signal must remain in the indicated state throughout the duration of the window or an error indication is sent to the error processing circuitry 26. The signal error is also sent to the error processing circuitry 26 when a strobe point comparison fails.

If certain channels of data are to be ignored in making the comparison (don't care), the signal mask data from the mask register 27 identifies such channels. Compare clock is chosen from the four phases of system clocks A-D by the two bits of clock select information from the status registers 28.

The four phases of system clocks A-D are produced by the clock generator circuitry 25 in response to timing control signals from the timing register 23.

Template pointer signals (4 bits) select pre-loaded information in the inhibit register 21, the timing register 23, and the mask register 27 with each tester cycle. This permits the inhibit data. mask data, and system clock A-D timing information to be varied with each tester cycle by the use of template choices, permitting "on-the-fly" control of these test vector characteristics, as will be further explained below.

Thus far, the description of the preferred embodiment has focused primarily on the electronic hardware used to control signals being applied to and received from the pins of the device under test. The discussion now shifts to the user interface where the invention actually resides. Decisions made at this user interface control the electrical signals which have been described previously. The portion of this control which is central to the invention occurs in a Template menu which will be described in detail below. Decisions made in this menu control data direction, compare masking, and control the timing of the edges of the four clocks used to position the data in time relative to the overall tester cycle.

Software and a microprocessor generate the user interface and load the information entered by the user at that interface into the hardware registers described above. In the hardware, that information is used to control the actual electrical signals as the test is executed. The details of the software implementation will not be described at all, since they are really immaterial to the invention. Any programing language and method of controlling a user interface could be used. What is central to the invention is the concept of organizing the information which defines a set of test signals into templates in order to simplify the user's task, conserve memory, and permit some test parameters to be more easily controlled without pausing in the execution of tests.

In fact, even all of the hardware of the foregoing discussion is inessential to the invention. The invention could be used in a logic simulator where all of the foregoing hardware did not exist - the simulator still has to perform all of the same functions with its simulation that the hardware accomplishes in a real tester. Nonetheless, understanding how test signals are controlled in a real environment is very useful to someone who desires to understand this invention in order to use it in the virtual environment of a logic simulator. Even in a virtual environment, all of the same decisions have to be made and the user is confronted with the same complexity and need for the templates of this invention to organize and simplify all of the decisions.

FIG. 3 shows a screen display containing the Channel menu. This menu is used to organize the channels into logical groups, give those groups names, assign the group a radix and source of timing, and make column masking decisions. Particular channels of the tester are associated with particular pins on the DUT in an additional menu, the DUT Wiring menu (not shown, but accessed through soft-key F2 36 at the bottom of the Channel menu).

FIGS. 4-9 are screen displays showing the Template menu with various fields opened to access more detail. This menu is identified by the word "Template" in an area at top of the screen 40. This menu is used to create the "templates" which are central to this invention. These templates are used to make th rest of the programming task much simpler and more manageable. The template provides a compilation of timing, direction, and masking decisions for all of the channels used during one vector (tester cycle) of data. Usually, all of the different types of transactions that are expected can be described with a limited set of templates.

In the preferred embodiment, there are a total of 64 templates available, 16 of which can be loaded into the hardware and ready for instantaneous use at any one time. (The others can be swapped in during program execution, but this results in the necessity for wait states in the tester's operation.) These templates, once defined, may be used again and again, bringing order and simplicity to the task of entering an amount of data which would otherwise be overwhelming.

The use of templates also helps with conserving memory resources, since pointing to the appropriate template stored once takes a lot less memory than repeatedly storing the information in the template for each tester cycle would take.

Starting from the upper left, the first user controlled field in the template menu is the "Template" field 42. This field is used to enter an identifying name for the template to be created, in this case "Cycle 6", or for moving to a template already named.

The next field, the "Lock" field 44, is used to prevent a particular template from being swapped out of the hardware registers during program execution. Here it is shown "Off". Sixteen of the sixty four total available templates are kept ready for instant use in hardware registers. When additional templates are needed, the tester enters a wait state while the required templates are moved into these registers. Entering an "On" in the lock field allows a user to identify a particular template as time critical, thereby preventing it from being moved out to make room for others, thus keeping templates so identified always available for instantaneous use. This is necessary for those parts of the test program where real-time execution is essential.

The "Resolution" field 46, here shown with "500 ps" entered, controls the choice of tester clock, and thereby determines the granularity of the edge placement choices available and the maximum length of a tester clock cycle. The "Resolution" field selects between one of two tester clocks, 500 ps or 20 ns, an external clock, or the 500 ps clock synchronized externally, as the timebase for hardware operation, thereby determining the maximum edge placement resolution available.

The "Length" field 48, shown here with "20 ns" entered, determines the length of each tester cycle controlled by this template. The "Length" field choices are a multiple of the value selected in the "Resolution" field.

Figure 5:
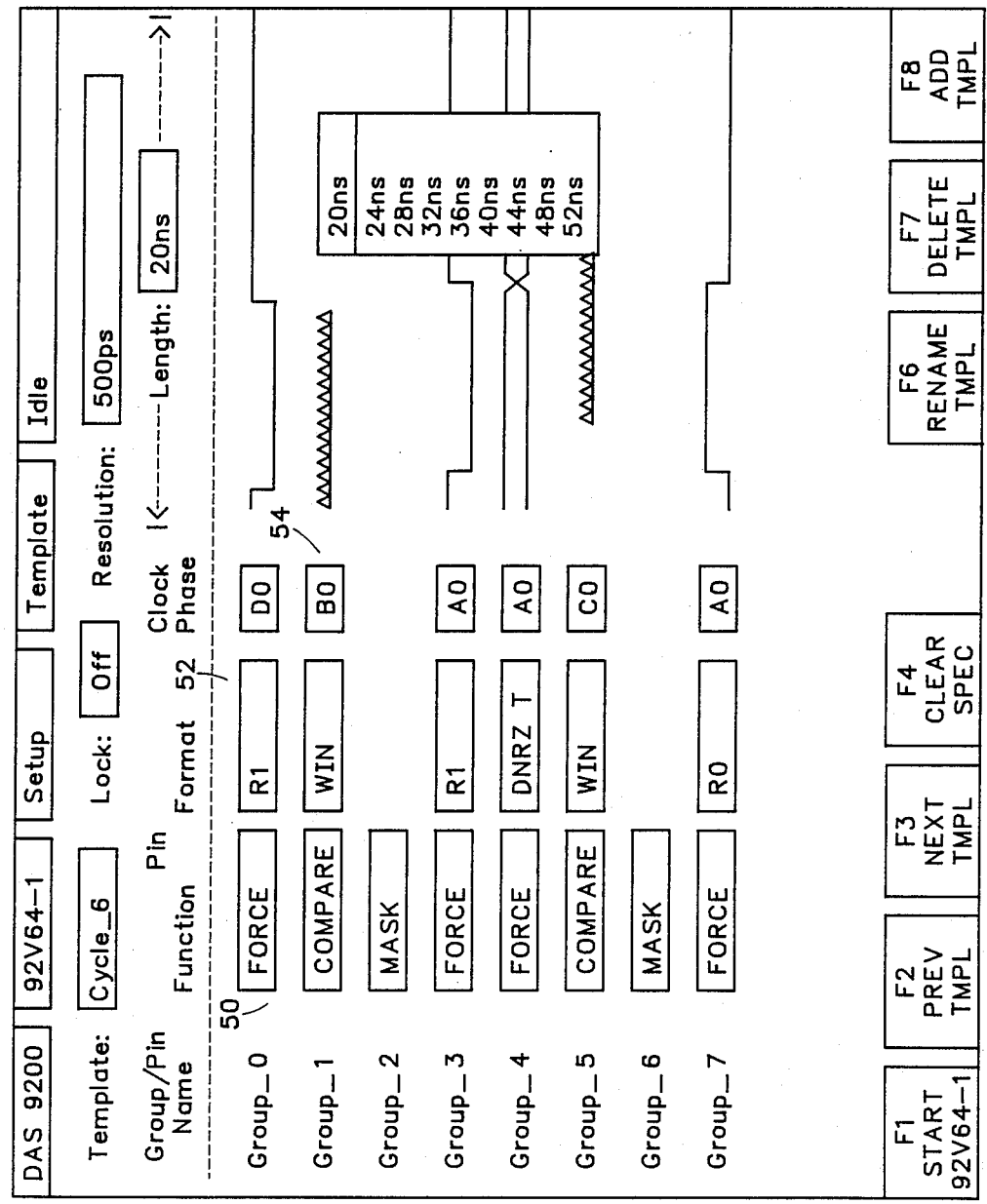
FIG. 5 is a screen display showing the Template menu with the "Length" field opened.

Referring now to FIG. 5, the "Pin Function" field 50 determines how a channel or group of channels is to be used during a particular vector. In the preferred embodiment, the choices are: COMPARE, FORCE, and MASK. Choices made in this field only affect the current template. That is, functions are selectable on a vector-by-vector basis. In contrast, the next two fields, labeled "Pin Format" 52 and "Clock Phase" 54, affect all templates. That is, these are not selectable on a vector-by-vector basis. When changes are made in these fields, a message warns the user: "CAUTION: Compare format assignment affects all templates". (This restriction is an arbitrary one, in terms of the invention. That is, these choices could be made on a vector-by-vector basis, but for design reasons that are extraneous to the invention a decision was made not to allow these choices in the instrument of the preferred embodiment.)

Referring to FIG. 6, when the field cursor is moved to the "Clock Phase" field 54 of a particular horizontal line, as it was for the line associated with "Group 5" 55 in this figure, two additional fields appear on that line to the right of the "Clock Phase" field 54 and slightly below it. These fields remain visible even after the field cursor has been moved back over to the "Pin Format" field 68, as has occurred here. These two fields, the "Delay" field 56 and the "Width" field 58, allow the user to make adjustments to the delay and width of the clock signal selected in the "Clock Phase" field 54. The adjustment values available will be multiples of the value selected in the "Resolution" field 46. A value entered in the "Delay" field 56 delays the leading edge of the associated clock signal and hence the beginning of the active portion of any signal being timed by either edge of that clock signal. The "Width" field 58 functions similarly to allow adjustment of the width of the clock signal and therefore serves to delay the trailing edge of that clock signal relative to its leading edge.

Decisions made by the user in the "Pin Function" field 50, the "Width" field 56, and the "Delay" field 58 control the contents of the inhibit, mask, and timing registers 21,27,23, discussed above. These registers are preloaded to contain sixteen choices of template so that these choices are available without any delay in tester output. They are accessed "on-the-fly" via the template pointer which is part of each vector of data in the pattern memory (not shown). Since only one template pointer, 4 bits wide, selects a much larger amount of preloaded information for numerous channels at the same time, total memory space requirements are greatly reduced.

Figure 7:
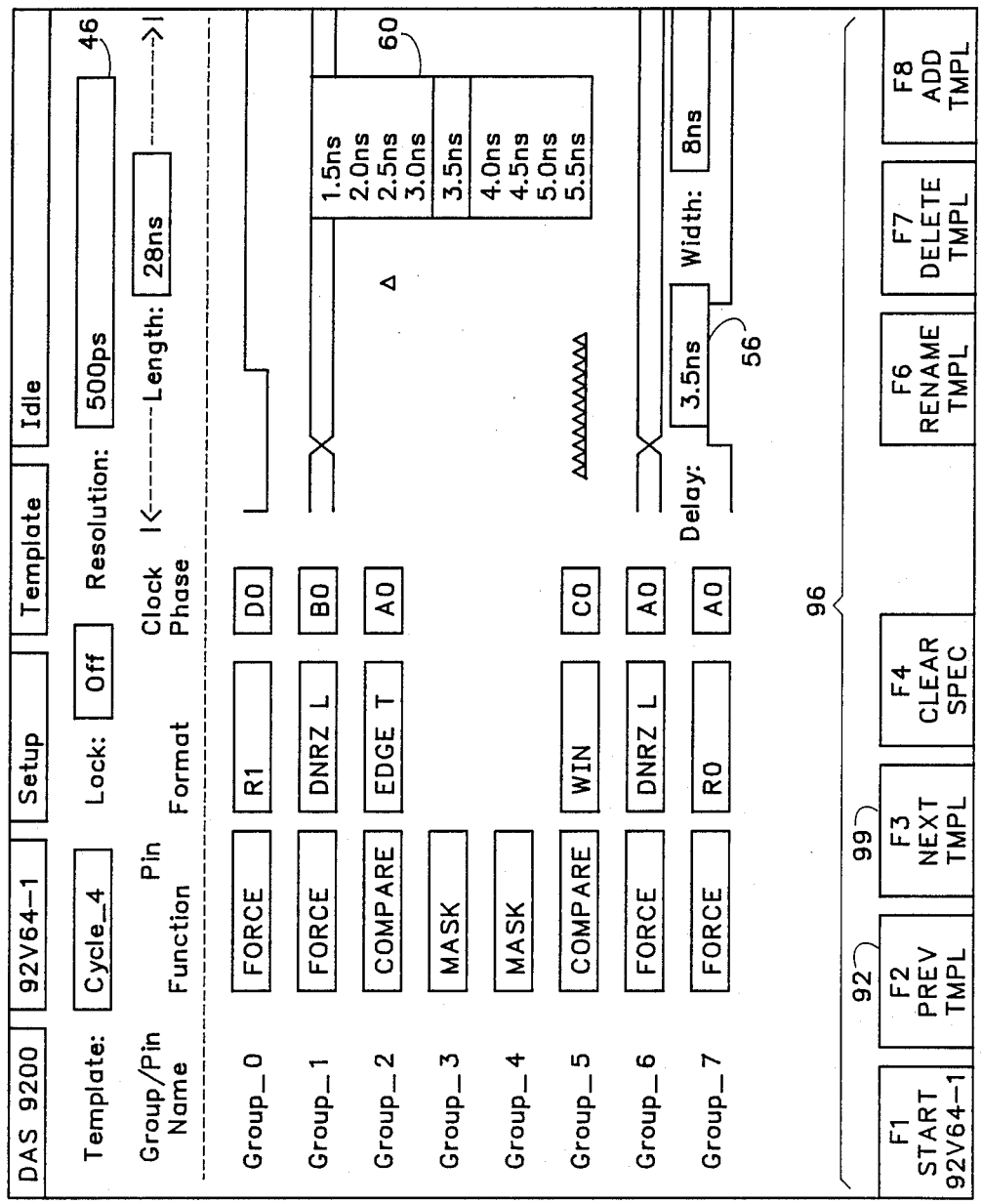
FIG. 7 is a screen display showing the Template menu with the "Delay" field opened.

When the "Open" key on the keyboard of the instrument (not shown) is pressed, it produces a pull-down mini-menu of choices relevant to whatever field the field cursor is in at that time. FIG. 7 shows the Template menu with the "Delay" field 56 opened to reveal a list of choices 60 of delay setting. Note that all of the choices are multiples of the value in the "Resolution" field 46.

Figure 8:
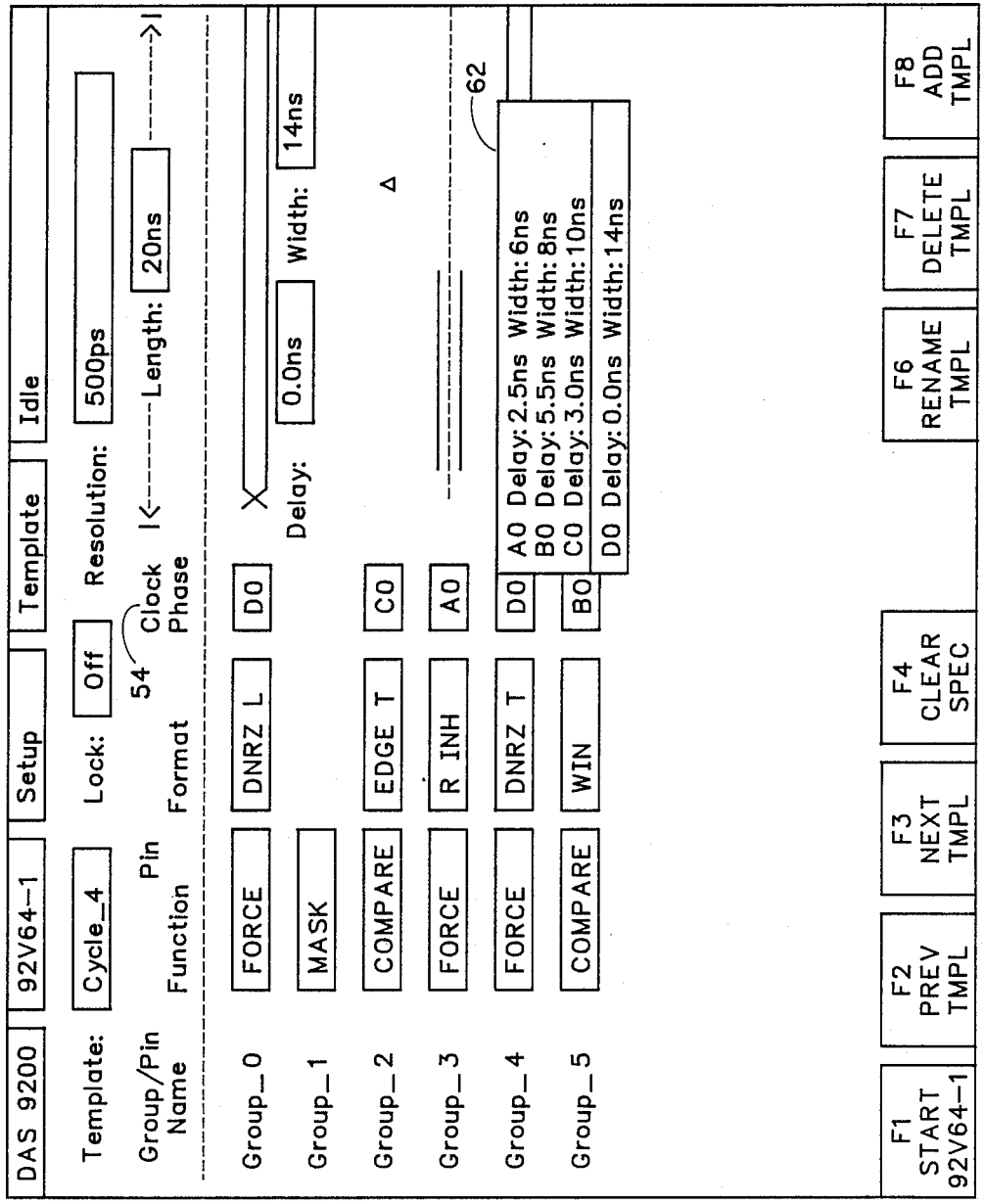
FIG. 8 is a screen display showing the Template menu with the Clock Phase window open within the "Clock Phase" field.

Referring to FIG. 8, when the "Open" key is pressed and the field cursor is in the "Clock Phase" field 54, the window 62 which opens shows the current delay and width settings for all of the clock signals. This allows a user to review the settings currently in effect for other clock phases while making decisions regarding one of them. Since the clock signals may each have several different events being timed off of both of their edges, the user wants to only make changes carefully and with an overview of the implications that these changes may have in other place where these settings are being used.

Visual feedback of user timing choices is provided in the large open area under the "Length" field 48 and to the right of the "Clock Phase" field 54. What appears in this area is, for force channels, a representation of the waveform that will appear at the tester output, and, for compare channels, an indication of when in time comparisons will occur. As choices are made in the "Pin Format" field 52, the "Clock Phase" field 54, the "Resolution" field 46, "Length" field 48, and the "Delay" and "Width" fields 56, 58, the effects on the tester are made visible in this visual feedback area. Relative timing relationships are made visible at a glance. Color is used to distinguish between force and compare data. Graphic symbols are used to distinguish between window compares and edge compares, with edges being shown with a minimum width and windows with a width that is proportional to their actual width. Similarly, single channels and groups of channels are shown with single lines and double lines respectively, while tri-stated channels are shown with blanks during inactive periods and little triangles during periods when comparisons are being made.

As was mentioned above, FIG. 2 shows a timing diagram of the formats available in the tester of the preferred embodiment. FIG. 6 shows a list of compare formats 64 opened for selection. To obtain this list the use pressed the "Open" hardkey on the keyboard (not shown) while the field cursor 68 was located in a row 55 which has COMPARE selected 70 in the "Pin Function" column 50. Referring to FIG. 9, when the field cursor is in a row 65 with FORCE selected 72, a list of force formats 66 is opened instead. Note that the highlighted selection on the opened list 64,66 corresponds to the choice entered in the "Pin Format" field 52 on the active row 55,65. Review FIGS. 4–9 to see illustrations of the visual feedback provided for the various format selections.

Referring to FIG. 7, function key identifiers 96 at the bottom of the Template menu allow the user to move between templates F2, F3, or rename templates F6, or add or delete templates F8, F7, or clear all the information entered in a template F4, by the use of the hard keys on the keyboard that correspond to the F#.

FIG. 10 is a screen display showing the Pattern menu. This is the menu actually used to organize the flow of test vector data to and from the device under test. The left-hand column, "Line Number" 80, contains a sequential reference number that locates that vector in the memory. The field at the top of this column 82 contains the number of the data location on which the cursor 84 is resting, and can be used to jump forward or backward in the memory by typing in the number of a line that is not shown on the screen, causing the display to move to that part of memory.

The next column in the Pattern menu is labeled "Select" 86 and contains a field 88 where the names of templates are entered. By entering a template name here, the user is invoking all of the decision making regarding pin function, masking and timing which was performed in the Template menus. The rest of the columns are for the entry of actual data and are labeled at the top with the names of the groups of channels which were defined in the Channel menu. Data is entered using the fields 90 at the top of each column in a radix selected in the Channel menu.

What is claimed is:

1. A user interface system for defining test vectors, the test vectors being composed of digital signals on a plurality of channels, each channel having timing characteristics that may be varied from vector to vector and the capability of going in two directions, input or output, or of being masked, during each vector, the system comprising:

means for generating templates, the templates reflecting a set of user choices regarding the timing characteristics, direction, and masking of each of the channels during one test vector, and means for associating the templates so generated with test vectors on a vector-by-vector basis.

2. A system for defining test vectors as recited in claim 1 wherein the means for generating provides visual feedback of user choices in the form of graphical representations of timing relationships.

3. An integrated circuit device tester having a plurality of clock sources and a plurality of channels and the capability of using a plurality of vectors to stimulate a device under test with force data and compare the output of the device under test with compare data, the tester comprising:

a hardware architecture wherein a plurality of tester channel functions are each controllable on a channel-by-channel and vector-by-vector basis, and a user interface, operable through software and a microprocessor to control the hardware architecture, having a menu structure that includes:

a channel menu for organizing channels into groups and giving those groups names, a template menu used to generate templates, each template reflecting an association of channel choices with channels and groups of channels, the template menu providing visual feedback reflecting the choices as they are made, and a pattern menu used to select a template for, and to enter force data in, each vector.

4. An integrated circuit device tester as recited in claim 3 wherein the channel choices include channel function, clock timing, and channel masking.

5. An integrated circuit device tester as recited in claim 3 wherein the template menu comprises:

means for choosing which function a channel or group of channels will be used for, means for adjusting the width of a clock source and the timing relationship between the clock source and the system clock, means for masking a channel or groups of channels, and means for producing visual feedback including timing diagrams reflecting the choices made.

6. An integrated circuit device tester as recited in claim 3 wherein the hardware architecture contains a register for storing the association of channel choices with channels and groups of channels made in template menu for use on a vector-by-vector basis so that selections between templates can be made without pauses in operation of the tester.

7. An integrated circuit device tester as recited in claim 6 wherein a memory for storing test vectors contains template pointers to access the register during each test vector.

8. A method for generating test vectors for use with a real or simulated integrated circuit device in a system with a clock source and a plurality of signal channels each of which is capable of performing a plurality of functions, and of masking channels, and of having varying imaging relationships between the clock source and a system clock, the method comprising the steps of:

preparing a set of templates that contain choices on a vector-by-vector basis of channel function, channel masking, and of clock source timing, associating the members of the set templates with sets of data; and using the templates and the sets of data so associated to generate the test vectors.

9. A method as recited in claim 8 wherein the step of preparing the set of templates includes the use of timing diagrams to provide visual feedback from the system to the user to assist the user in choosing functions and adjusting timing relationships.

* * * * *

UNITED STATES PATENT AND TRADEMARK OFFICE
CERTIFICATE OF CORRECTION

PATENT NO.   :   4,860,291
DATED        :   August 22, 1989
INVENTOR(S)  :   Wendell W. Damm et al.

It is certified that error appears in the above-identified patent and that said Letters Patent is hereby corrected as shown below:

In claim 8, sixth line, "imaging" should be --timing--.

Signed and Sealed this

Twenty-fourth Day of July, 1990

Attest:

HARRY F. MANBECK, JR.

*Attesting Officer*  *Commissioner of Patents and Trademarks*